United States Patent
Miyoshi

(10) Patent No.: US 10,777,778 B2
(45) Date of Patent: Sep. 15, 2020

(54) FLEXIBLE ORGANIC EL PANEL

(71) Applicant: KANEKA CORPORATION, Osaka-shi, Osaka (JP)

(72) Inventor: Takayuki Miyoshi, Otsu (JP)

(73) Assignee: KANEKA CORPORATION, Osaka-shi, Osaka (JP)

(*) Notice: Subject to any disclaimer, the term of this patent is extended or adjusted under 35 U.S.C. 154(b) by 0 days.

(21) Appl. No.: 16/624,113

(22) PCT Filed: Jun. 21, 2018

(86) PCT No.: PCT/JP2018/023685
§ 371 (c)(1),
(2) Date: Dec. 18, 2019

(87) PCT Pub. No.: WO2019/004061
PCT Pub. Date: Jan. 3, 2019

(65) Prior Publication Data
US 2020/0220115 A1    Jul. 9, 2020

(30) Foreign Application Priority Data
Jun. 26, 2017    (JP) .................... 2017-124529

(51) Int. Cl.
*H01L 51/56*    (2006.01)
*H01L 51/52*    (2006.01)
(Continued)

(52) U.S. Cl.
CPC .......... *H01L 51/56* (2013.01); *H01L 51/0097* (2013.01); *H01L 51/5268* (2013.01);
(Continued)

(58) Field of Classification Search
CPC .................... H01L 51/0097; H01L 2251/5338
See application file for complete search history.

(56) References Cited

U.S. PATENT DOCUMENTS

2007/0228369 A1* 10/2007 Suzuki ............... H01L 51/5206
257/40
2016/0141528 A1    5/2016 Masuyama et al.

FOREIGN PATENT DOCUMENTS

JP    2004079432 A    3/2004
JP    2008234928 A    10/2008
(Continued)

OTHER PUBLICATIONS

European Patent Office, Extended European Search Report Issued in Application No. 18822833.2, dated May 28, 2020, Germany, 8 pages.

*Primary Examiner* — Daniel P Shook
(74) *Attorney, Agent, or Firm* — Alleman Hall Creasman & Tuttle LLP

(57) ABSTRACT

With chemically-strengthened thin glass substrates provided with an alkali barrier film, if the light-absorbing or light-scattering nature of the alkali barrier film itself has lowered the light extraction efficiency, or if the surface of the alkali barrier film is insufficiently flat, there may consequently be an increase in leakage current of an organic EL element and a decrease in reliability, leaving room for improvement. Instead of such an alkali barrier film, by providing an organic EL panel with a barrier film of the present invention and also with an organic EL element on a chemically-strengthened thin glass substrate with a specific light extraction structure therebetween, the glass substrate having one principal surface that includes a smooth region of the present invention, a high-performance organic EL panel can be obtained without compromising the organic EL properties.

5 Claims, 1 Drawing Sheet

(51) Int. Cl.
*H05B 33/14* (2006.01)
*H05B 33/10* (2006.01)
*H01L 51/00* (2006.01)

(52) U.S. Cl.
CPC ............. *H05B 33/10* (2013.01); *H05B 33/14* (2013.01); *H01L 2251/5338* (2013.01)

(56) References Cited

FOREIGN PATENT DOCUMENTS

| | | | |
|---|---|---|---|
| JP | 2012174410 A | 9/2012 |
| JP | 2014013668 A | 1/2014 |
| JP | 2014028743 A | 2/2014 |
| JP | 2015156306 A | 8/2015 |
| WO | 2006061964 A1 | 6/2006 |
| WO | 2011111629 A1 | 9/2011 |

\* cited by examiner

FLEXIBLE ORGANIC EL PANEL

TECHNICAL FIELD

The present invention relates to an organic EL element including a chemically strengthened thin-plate glass base material and a flexible organic EL panel.

BACKGROUND ART

Organic EL elements are surface light-emitting elements that utilize a phenomenon that light is emitted when an electric field is applied to a substance. Further, application of organic EL panels, in which an organic EL element is formed on a substrate, to planar light sources, displays, and the like is attempted by taking advantage of a feature that modification into a self-luminous type or a thin type is possible.

Currently, among organic EL panels, foldable (also referred to as flexible or bendable) organic EL panels are attracting attention. In order to realize a flexible organic EL panel, it is necessary to form an organic EL element on a substrate having flexibility. Further, since organic functional materials used for light-emitting layers, etc. of organic EL elements are apt to be deteriorated by moisture or oxygen, and this causes generation of dark spots or a decrease in luminous efficiency, it is necessary for a substrate to have a high barrier property against oxygen or moisture entering from outside of the element. In this regard, it is known that use of thin-plate glass as an element-forming substrate for organic EL elements can achieve both flexibility and a high barrier property (Patent Document 1).

However, thin-plate glass is easily broken, and a decrease in yield in a manufacturing process for forming an organic EL element on thin-plate glass is a problem. Thus, Patent Document 2 discloses a glass substrate for forming an organic EL element, in which a compressive stress layer is formed on the glass substrate by chemical strengthening in order to prevent cracking or chipping of thin-plate glass, and an alkali barrier film is formed in contact with the glass base material surface of the chemically strengthened glass base material. As the alkali barrier film, a film of $SiO_2$ or $SiN_X$ formed by sputtering, CVD, or the like is exemplified.

Patent Document 1: Japanese Unexamined Patent Application, Publication No. 2004-79432

Patent Document 2: Japanese Unexamined Patent Application, Publication No. 2014-028743

DISCLOSURE OF THE INVENTION

Problems to be Solved by the Invention

However, in the glass substrate for forming an organic EL element of Patent Document 2, it is a concern that light extraction efficiency decreases due to properties of alkali barrier film itself, such as light absorption or light scattering; or if flatness of the surface of an alkali barrier film is insufficient, such insufficiency increases leakage current of the organic EL element, resulting in a decrease in reliability. Therefore, there is room for improvement.

Means for Solving the Problems

The inventors of the present invention have found that when using a chemically strengthened thin-plate glass base material comprising, instead of the above-mentioned alkali barrier film, a specific alkali barrier film as an element-forming substrate to form an organic EL element thereon, and forming an organic EL panel, it is possible to obtain a high-performance flexible organic EL panel, and have completed the invention.

Specifically, the flexible organic EL panel is an organic EL panel comprising: as a base material, a thin-plate glass which has an average thickness of 2 mm or less and which is chemically strengthened for preventing cracking or chipping; as an element-forming substrate, a chemically strengthened thin-plate glass base material comprising a specific alkali barrier film, which has a function of preventing an alkali component from the chemically strengthened glass from entering an organic EL element and which includes a specific smooth surface region in a region having an element-forming region on which the organic EL element is formed; and the organic EL element formed on the element-forming substrate.

Namely, the present invention is a flexible organic EL panel, comprising a chemically strengthened thin-plate glass base material having an average thickness of 2 mm or less and an organic EL element, with the flexible organic EL panel having a light-emitting region corresponding to the organic EL element on its light-emitting surface, in which an element-forming substrate comprising an alkali barrier film comprising an amorphous silica-based film is formed on an entire surface of one main surface of the chemically strengthened thin-plate base material, and the organic EL element is formed in contact with an element-forming region of the alkali barrier film;

the alkali barrier film has a smooth surface region on a surface in the side in contact with the organic EL element, and further; the smooth surface region has a surface smoothness of Ra of 5 nm or less and includes the element-forming region in plan view.

Since such a flexible organic EL panel of the present invention comprises a chemically strengthened thin-plate glass base material including a specific alkali barrier film as the element-forming substrate, the flexible organic EL panel has high performance and high reliability while having excellent flexibility such that cracking or chipping hardly occurs.

Further, it is preferable for the alkali barrier film to include a photocurable resin-containing flattening layer between the amorphous silica-based film and the organic EL element in the smooth surface region in plan view. A smooth surface region having a more excellent smoothness can be easily formed and the alkali barrier property can be further improved. Thus, the flexible organic EL panel becomes more reliable. This effect is particularly remarkable when an uneven layer, described below, is included.

The flattening layer is preferably a light scattering flattening layer containing fine particles of transparent metal oxide having a refractive index of 1.8 or more. Difference in refractive indices from materials constituting the organic EL element becomes small, and this can reduce the influence of a decrease in light extraction efficiency due to total reflection caused by smoothness of the smooth surface. Additionally, an effect of improvement in light extraction efficiency due to light scattering inside the flattening layer can be expected. Therefore, the flexible organic EL panel has a higher luminous efficiency.

Further, it is preferable for the alkali barrier film to include an uneven layer in the element-forming region in plan view between the chemically strengthened thin-plate glass base material and the amorphous silica-based film, the uneven layer containing at least one selected from the group consisting of thermoplastic resins and glass frits, and the uneven layer having an uneven surface in the amorphous silica-based film side. Since the alkali barrier property can be further improved, the flexible organic EL panel becomes more reliable and influence of a decrease in light extraction efficiency due to total reflection described above can be reduced, which results in improvement in light extraction efficiency. Therefore, the flexible organic EL panel becomes a flexible organic EL panel having a further higher luminous efficiency.

Further, the uneven layer is preferably an acrylic resin-based uneven layer containing an acrylic resin as a main component. Such a flexible organic EL panel is excellent in transparency and weather resistance, and becomes a flexible organic EL panel having an even higher luminous efficiency and higher reliability. Such an acrylic resin-based uneven layer is preferably formed in a large area and in an easy manner by a method in which a plate mold having an inverted uneven surface is brought into contact with an acrylic resin-based layer while being heated to a temperature equal to or higher than the melting temperature of the acrylic resin, that is, it is preferably formed by a nanoimprint method or a roll forming method.

Effects of the Invention

According to the present invention, a flexible organic EL panel having a high reliability, high mechanical strength, and a high luminous efficiency can be achieved.

PREFERRED MODE FOR CARRYING OUT THE INVENTION

Figure 1:
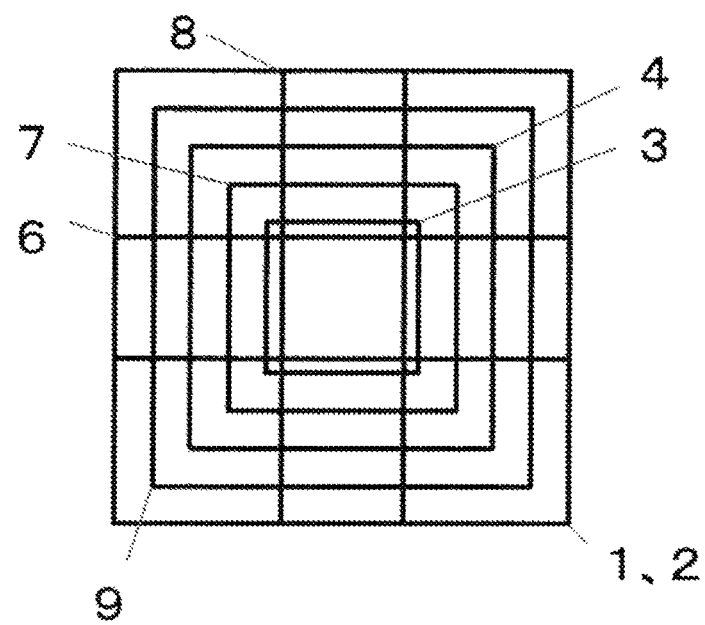
FIG. 1 is a plan view for explaining manufacturing procedures of the organic EL panel of Example 1, and is a plan view showing a film forming region of each layer.
Figure 2:
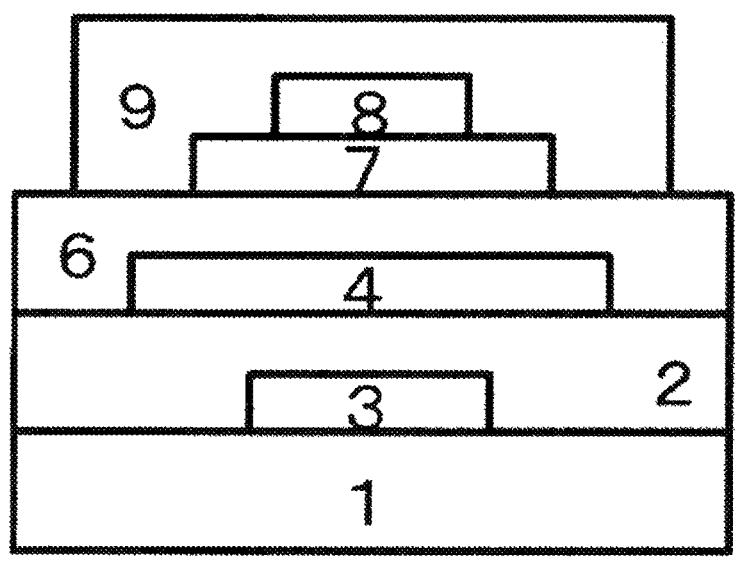
FIG. 2 is a schematic cross-sectional view showing the cross-sectional structure of the organic EL panel of Example 1.

Embodiments of the present invention are described below.

(Flexible Organic EL Panel)

The flexible organic EL panel of the present invention is a sheet-shaped light source member, comprising, as both main surfaces thereof, a light-emitting surface comprising a light-emitting region corresponding to the organic EL element, and a sealing surface, on which the organic EL element is formed and disposed and on which a sealing layer formed on the organic EL element is disposed to prevent moisture from entering the organic EL element.

The sealing layer is a layer formed in order that the organic EL element including an organic functional layer and a reflective electrode layer, both of which are described below, are not deteriorated by contact with air, and is formed on the entire surface of the reflection electrode layer side of the organic EL element, namely over the circumference thereof, including an entire region to be a light-emitting region when observed from the light-emitting surface side.

As a material for such a sealing layer, an inorganic substance may be exemplified from the viewpoint of imparting a sufficient water vapor barrier property to the layer. The material is preferably silicon oxide and/or nitride, and more preferably an inorganic thin film, from the viewpoint of utilizing flexibility of the chemically strengthened thin-plate glass base material and producing a flexible organic EL panel. The material even more preferably includes a thin film formed by subjecting the above-mentioned silicon-based material to a CVD method. The most preferred material is a multilayered film in which a wet method silicon-based material film is formed on the CVD method silicon-based material thin film. The wet method silicon-based material film is preferably a polysilazane conversion film. An average thickness of these silicon-based material films by the CVD method and/or the wet method is 0.5 μm or more and 5 μm or less.

(Method for Manufacturing Flexible Organic EL Panel)

For instance, in forming an organic EL element on a chemically strengthened thin-plate glass base material, the method for manufacturing the flexible organic EL panel of the present invention comprises sequentially performing: a step of forming an alkali barrier film for preventing diffusion of an alkali component eluted from the chemically strengthened thin-plate glass base material into the organic EL element, on the organic EL element disposition surface side of the chemically strengthened thin-plate glass base material; then a step of forming a smooth surface region according to the present invention on the surface of the alkali barrier film; and then a step of forming the organic EL element on the smooth planar region.

In the alkali barrier film forming step, it is important to form the alkali barrier film continuously and without gaps on the entire of one main surface, which is an organic EL element disposition surface of the chemically strengthened thin-plate glass base material, from the viewpoint of easily producing a panel of high reliability. It is important to use an amorphous silica-based film as such a continuous film from the viewpoint of imparting sufficient flexibility to the flexible organic EL panel of the present invention. Namely, the alkali barrier film according to the present invention includes at least an amorphous silica-based film as a continuous layer. Additionally, such an alkali barrier film according to the present invention preferably includes a flattening layer described below, and more preferably includes an uneven layer described below.

In the step of forming a smooth surface region, the smooth surface region may be formed by polishing a surface of the amorphous silica-based film, but preferably, may be formed by a manufacturing method in which the flattening layer is formed on the amorphous silica-based film, and more preferably, may be formed by a coating method using a slit coater or the like.

In the step of forming an organic EL element, when it is difficult to perform work handling with a thin chemically strengthened thin-plate glass base material as a single body, it is preferable to apply a temporary fixing process in which the other main surface of the chemically strengthened thin-plate glass base material is attached to a support in advance and peeled from the support after forming the organic EL element. It is more preferable to attach a film to or to form a resin coating layer on the other main surface in order to reinforce the base material in advance, so that surfaces thereof are formed in advance as stable peeling surfaces with the support. It is further preferable to perform the peeling after forming the sealing layer.

Hereinafter, members that constitute the flexible organic EL panel of the present invention and constituent elements related to the method for manufacturing the members will be described one by one.

[Chemically Strengthened Thin-Plate Glass Base Material]

The chemically strengthened thin-plate glass base material according to the present invention is a translucent glass sheet including, as a main surface, a surface on which the organic EL element according to the present invention is disposed and needs to have an average thickness of 2 mm or less, preferably 0.5 mm or less, and more preferably 0.3 mm or less, from the viewpoint of making the flexible organic EL panel according to the present invention thin and light and further imparting bendable or flexible characteristic to the panel. From the viewpoint of the final assemblable thickness, it is preferable for the chemically strengthened thin-plate glass base material to have an average thickness of 0.01 mm or more. Moreover, it is necessary for the thin-plate glass base material to be chemically strengthened from the viewpoint of improving strength against cracking when the glass is thinned and providing a panel that can withstand practical use. It is preferable for end surfaces to have undergone machining from the viewpoint of making it a base material of sufficient strength, even if it is thin. The chemically strengthened thin-plate glass base material is preferably colorless and transparent, and the transmittance of visible light thereof is preferably 90% or more in the entire visible light region, e.g., the wavelength range of 380 to 780 nm, from the viewpoint of light extraction efficiency. As the structure of such a chemically strengthened thin-plate glass base material, not only a single layer but also a multilayer has no problem, and even a treatment layer or a coating film formed on any one of the surfaces for the purpose of improving abrasion resistance, smoothness, and strength against cracking causes no problem.

The chemically strengthened thin-plate glass base material according to the present invention preferably has a refractive index of 1.50 to 1.60, a flexural modulus of 1,000 to 10,000 MPa, and a flexural strength of 30 to 300 MPa.

[Alkali Barrier Film]

The alkali barrier film according to the present invention has a function of preventing an alkali component contained in the strengthened thin-plate glass base material from entering the organic EL element, and is a layer formed on the main surface of the strengthened thin-plate glass base material.

The alkali barrier film is preferably an oxide having a bond dissociation point of oxygen having a negative charge from the viewpoint of capturing alkali ions having a positive charge, and is furthermore preferably colorless and transparent. The transmittance is preferably 85% or more in the entire visible light region and the refractive index is about 1.5 to 2.0 which is equal to or more than that of the glass substrate from the viewpoint of light extraction efficiency. Additionally, it is necessary that cracks and the like do not occur and the alkali barrier film adheres to the base material with sufficient strength when the alkali barrier film is bent, and it is desirable that the film can be formed continuously and without gaps on the entire main surface by a simple method. From such viewpoints, a layer containing an amorphous silica-based film is used in the present invention.

From the viewpoint of ensuring adequate denseness and defect-free properties, such an amorphous silica-based film is preferably an $SiO_x$ film or an amorphous silica-based composite oxide film formed by one method selected from the group consisting of sputtering film formation, ion plating film formation and coating film formation. More preferably, the amorphous silica-based film is one or more types selected from the group consisting of an $SiO_x$ film including an SiO film and an $SiO_2$ film, etc. formed by the ion plating film formation, a polysilazane conversion $SiO_2$ film formed by the spin coating film formation, and an amorphous silica-based composite oxide film formed by the sputtering film formation. When an uneven shape of the uneven layer described below is reproduced at the organic EL element side interface of the amorphous silica-based film to improve light extraction efficiency, it is preferable to use an amorphous silica-based film formed by the ion plating film formation or/and the sputtering film formation, which are gas phase film formation methods having an excellent surface shape-tracing property.

As described above, the alkali barrier film according to the present invention has a smooth surface region having a surface smoothness of Ra of 5 nm or less, preferably 1 nm or less, on the surface in the side in contact with the organic EL element.

Such a smooth surface region has an element-forming region, which is a region in contact with the organic EL element in the region, and can be formed by polishing the surface of the amorphous silica-based film as described above. It is, however, preferable to form the smooth surface region by forming a flattening layer on the amorphous silica-based film, from the viewpoint of relaxing internal stress while reinforcing a defect portion of the amorphous silica-based film, and thereby making up its alkali barrier performance and ultimately ensuring the function of the alkali barrier film of preventing an alkali component from entering the organic EL element.

Such a flattening layer is formed in a region including the element-forming region in plan view. When an uneven layer described below is included, the flattening layer is formed so as to cover the entire surface of the uneven layer in plan view, and is formed between the amorphous silica-based film and the organic EL element in the cross-sectional structure.

From the viewpoint of easily forming a layer of the surface smoothness, the constituent material of such a flattening layer preferably contains as a main component a photocurable resin, which is applied as a liquid having a relatively low viscosity and then cured, whereby a good surface smoothness can be easily obtained. It is more preferable that the flattening layer is a light scattering flattening layer formed of a material containing fine particles of a transparent metal oxide having a refractive index of 1.8 or more in the photocurable resin, from the viewpoint of improving the light extraction efficiency and forming a panel having a higher luminous efficiency.

With respect to the fine particles of such a transparent metal oxide, the preferable number average particle diameter is preferably 0.05 μm to 3 μm from the viewpoint of exerting a preferable light scattering property, and as a material thereof, a metal oxide containing one or more metals selected from the group consisting of Ti, Zr, In, Zn, Se, and W, or a composite metal oxide is preferable.

In addition, from the viewpoint of suppressing material cost while ensuring a sufficient surface smoothness, the average layer thickness of the flattening layer is preferably 1 μm or more and 3 μm or less.

In other words, the flattening layer formed, as a part of the alkali barrier film, on the amorphous silica-based film according to the present invention is preferably a translucent smoothing layer containing scattering fine particles. The diameter of the fine particles is preferably 0.05 μm to 3 μm from the viewpoint of scattering light in the visible light region. The refractive index of the translucent flattening layer is preferably 1.8 to 1.9 from the viewpoint of inhibiting total reflection occurring at the interface with ITO. The transmittance in the entire visible light region is preferably 85% or more. The arithmetic mean roughness Ra of the organic EL element film forming surface needs to be 5 nm or less, preferably 2 nm or less, and more preferably 1 nm or less.

Here, in relation to the expression "light extraction" used in the specification above, the "light extraction structure" is further described as follows.

The light extraction structure according to the present invention is a structure for achieving a panel with a high luminance, i.e., a high luminous efficiency, by increasing the ratio of emitted light with regard to generated light close to 1, namely, making the ratio of extracted light larger, namely, increasing the "light extraction" efficiency, when making light generated in an inner area, particularly in an inner area of an organic functional layer, described below, of the organic EL element, radiate outward from a light-emitting region, which corresponds to the organic EL element of a light-emitting surface of the flexible organic EL panel of the present invention, which includes as both main surfaces the light-emitting surface and a sealing surface described below, on which a sealing layer is formed. Specifically, the light extraction structure is a structure for reducing total reflection occurring at the interface between media having different refraction indices when light enters a low refractive index medium (e.g., a normal glass plate) from a high refractive index medium (e.g., an inner area of the organic EL element), by changing light emission angle.

One of the features of the present invention is to configure such a "light extraction structure" in the alkali barrier film according to the present invention, while relating the light extraction structure to the amorphous silica-based film which is an essential element thereof, so that the flexibility of the panel according to the present invention can be effectively exerted, for instance, even when flexed, reliability can be maintained. Namely, the alkali barrier film according to the present invention includes, as an essential element, an amorphous silica-based film which is excellent in flexure following property. More preferably, the alkali barrier film includes an uneven layer described below, the flattening layer and the chemically strengthened thin-plate glass base material, and in addition to the above, one or more layers selected from the group consisting of the attachment film layer and the resin coating layer, both of which are described above, on the main surface for reinforcement, and further for reinforcement at the time of flexure.

The uneven layer according to the present invention is a structure constituting such a light extraction structure, and has a function of changing light emission direction at the interface between media having different refractive indices to improve the light extraction efficiency. It is one of the features of the present invention that the uneven layer is formed in the element-forming region in plan view between the chemically strengthened thin-plate glass base material and the amorphous silica-based film. When the panel is flexed, while relaxing stress on the amorphous silica-based film loaded by the chemically strengthened thin-plate glass base material, using a bellows structure, the uneven layer prevents detachment of the amorphous silica-based film from the chemically strengthened thin-plate glass base material side, using an anchor structure thereof. Thereby, the uneven layer prevents occurrence of defects such as cracking of the amorphous silica-based film and retention of an alkali component to the interface of the amorphous silica-based film on the chemically strengthened thin-plate glass base material side. Thus, the uneven layer also has a function of securing the alkali barrier performance of the amorphous silica-based film of the present invention. Namely, in the uneven layer according to the present invention, the uneven structure itself contributes to increase in luminous efficiency of the panel, and the bellows structure and the anchor structure contribute to increase in reliability of the panel. Here, since such an uneven layer is separated from the organic EL element by the amorphous silica-based film and is present on the chemically strengthened thin-plate glass base material side, even when defects or cracks occur in the layer itself, the uneven layer does not deteriorate the alkali barrier performance of the alkali barrier film itself according to the present invention, which is important.

From the viewpoint of reducing total reflection by changing the emission angle of light, the uneven layer has an uneven shape such as a pyramid shape, a micro lens shape, or a moth-eye shape on the amorphous silica-based film side, which is in the opposite side to the chemically strengthened thin-plate glass base material. The uneven surface which is a surface of the uneven shape as described above corresponds to the bellows structure or the anchor structure described above.

The refractive index of such an uneven layer is desirably 1.5 to 1.6 from the viewpoint of inhibiting total reflections occurring at interfaces from the alkali barrier film to the organic EL element. As a material for forming this, one or more materials selected from the group consisting of thermoplastic resins and glass frits are preferable, and it is more preferable that the uneven layer is an acrylic resin-based uneven layer containing an acrylic resin as a main component.

[Organic EL Element]

The organic EL element according to the present invention is a light emitting device including a transparent electrode layer, an organic functional layer and a reflective electrode layer, further including an organic functional layer which contains a light emitting layer containing an organic compound, between the transparent electrode layer and the reflective electrode layer. An overlapping portion of these layers is the element, and light is emitted by supplying power to the transparent electrode layer and the reflective electrode layer from outside.

It is the flexible organic EL panel according to the present invention that such an organic EL element is formed on the element-forming substrate according to the present invention provided with an alkali barrier film containing at least a specific amorphous silica-based film formed on a chemically strengthened thin-plate glass base material as described above. It is also a feature of the present invention that the organic EL element is formed so as to be in contact with the element-forming region of the alkali barrier film, whereby the effect of the present invention is achieved.

The transparent electrode layer is in contact with the alkali barrier film according to the present invention and is formed in the element-forming region according to the present invention in plan view. As a material for forming this, any material can be used as long as it has high translucency and electrical conductivity, but from the viewpoint of reliability and luminous efficiency, a transparent electroconductive metal oxide is preferred. More preferably, the transparent electrode layer is formed as a transparent electrode layer included in a film of the material, including the transparent electrode layer-side power feeding portion relating to power feeding to the transparent electrode layer.

As such a transparent conductive metal oxide, ITO or IZO can be exemplified, and the average thickness thereof is preferably 1 μm or less and a thin plate of such a material can be formed by a vacuum deposition method such as a CVD method or a PVD method.

The organic functional layer generally has a multilayer structure of, for example, a hole injection layer/a hole transport layer/a light emitting layer/an electron transport layer/an electron injection layer from the transparent electrode layer side, and may include a connection layer including a charge generation layer or a charge blocking layer, etc., in addition to these layers.

As a material for forming the reflective electrode layer, aluminum or silver which has a large reflectance and is effective for improving luminance is preferred. As a film forming method thereof, a vacuum evaporation method in which a high-purity film can be formed and intrinsic physical properties of a material can be easily obtained is preferable. More preferably, the reflective electrode layer is formed as a reflective electrode layer included in a film of the material, including the reflective electrode layer-side power feeding portion relating to power feeding to the reflective electrode layer.

EXAMPLES

Hereinafter, the present invention is described in detail by the Examples, but the present invention is not limited by these Examples.

Example 1

First, DCG-1 (size: 3 cm×3 cm, thickness: 0.2 mm, all end surfaces having undergone machining) was provided as a chemically strengthened thin-plate glass base material 1, manufactured by HOYA Corporation.

Upon carrying out a flexibility test using this large-sized chemically strengthened thin-plate glass base material (size: 145 cm×25 cm, thickness: 0.2 mm, all end surfaces having undergone machining), it could be confirmed that the chemically strengthened thin-plate glass base material was sufficiently usable as a base material for element-forming substrates for flexible organic EL panels. Specifically, upon performing a three-point bending test on this large-sized chemically strengthened thin-plate glass base material, it was confirmed that bending fracture occurred at a radius of curvature of 30 mm, and the base material was bendable to a radius of curvature of 70 mm or less, which is considered to be necessary as the base material. In addition, upon performing an end surface impact strength test in which impact was applied to an end surface of a base material, a result of breaking at an impact energy of 30 mJ was obtained, and the base material was confirmed to have a required resistance as a base material, that is, resistance to an end surface impact energy of 24 mJ or more.

Subsequently, in order to form an uneven layer 3 on a region of 1 cm×1 cm in the center of one main surface of a chemically strengthened thin-plate glass base material 1, an acrylic resin film (average thickness of 40 μm, refractive index of 1.5) for forming an uneven structure was mounted, and then an inverted pyramid-shaped nano-imprint mold heated to 150° C. was pressed and melted, whereby the chemically strengthened thin-plate glass base material 1 to which the acrylic resin uneven layer 3 having an average layer thickness of 2 μm in the pyramid shape was fused was manufactured.

Subsequently, in order to form an SiO film 2 to a thickness of 15 nm as an alkali barrier film 2, using a sputtering apparatus, on an entire surface of the one main surface of this chemically strengthened thin-plate glass base material 1 with the acrylic resin-based uneven layer 3, with the one main surface including an entire surface of the uneven layer 3; and to further form a light scattering flattening layer 4 on a region of 2.0 cm×2.0 cm in the center of the one main surface, which includes a region including the entire surface of the uneven layer 3 of the alkali barrier film 2, an acrylic photosensitive resin containing $TiO_2$ fine particles (number average particle diameter of 0.1 μm, refractive index of 1.9): a UV curable functional hardcoat agent Lioduras® manufactured by Toyo Ink, was applied, dried, and UV-cured to form a translucent light scattering flattening layer 4 having an average layer thickness of 3 μm.

In this manner, the element-forming substrate of Example 1 was manufactured. Note that the surface of this element-forming region of the light scattering flattening layer 4 of the element-forming substrate of Example 1 had a surface smoothness Ra of 1.5 nm. Subsequently, an ITO film 6 was formed on a region of 0.8 cm×3.0 cm in the center of the one main surface, with the region partially including the region of the uneven layer 3 of the element-forming substrate of Example 1, as a transparent conductive film 6 including a transparent electrode layer, which is a part of the organic EL element, and a transparent electrode layer-side power feeding portion. Note that this ITO film 6 was formed by the sputtering method at a substrate temperature of 180° C. so as to have an average thickness of 120 nm.

As described below, the sheet resistance of the ITO film 6 formed on the element-forming substrate of Example 1 was 10.9 Ω/sq.

Subsequently, this element-forming substrate after the ITO film 6 being formed was introduced into a vacuum heating evaporation apparatus, and a step of forming an organic functional layer 7 and a reflective conductive film 8 was performed.

Specifically, using a mask, a hole injection layer/a hole transport layer/a light emitting layer/an electron transport layer/an electron injection layer were formed in order on a 1.5 cm×1.5 cm region in the center of the one main surface including the entire region of the uneven layer 3, as the organic functional layer 7, and further thereon, an Al film was formed using a mask, as a reflective conductive film 8 including a reflective electrode layer and a reflective electrode layer-side power feeding portion on a region of 3.0 cm×0.8 cm, which is in the center of the one main surface partially including the region of the uneven layer and which is in the direction orthogonal to the direction of the ITO film forming region.

In this manner, the organic EL element of Example 1 was produced. Note that the organic EL element of Example 1 is formed in the element-forming region of a size of 0.8 cm×0.8 cm in the center of the element-forming substrate of Example 1 and in the same size, and has the transparent electrode layer-side power feeding portion in the vicinity of one of opposite sides and the reflective electrode layer-side power feeding portion in the vicinity of the other of the opposite sides.

Finally, a sealing layer 9 was formed on a region of 2.5 cm×2.5 cm in the center of the one main surface so as to cover all the surfaces of the organic EL element. Specifically, a silicon oxynitride layer (average thickness: 2 μm) and a polysilazane-conversion silica layer (average thickness: 2 μm) were formed in order from the reflective electrode layer side, over all the surfaces of exposed surfaces of the organic EL element of Example 1 and over a part including the reflective electrode layer-side power feeding portion (including a power feeding terminal for anode and a power feeding terminal for cathode) as a continuous inorganic sealing layer 9, using CVD method.

In this manner, using an element-forming substrate in which the uneven layer 3, the alkali barrier film 2 and the light scattering flattening layer 4 were formed in order on the chemically strengthened thin-plate glass base material, an organic EL element was formed in the element-forming region thereof, and the inorganic sealing layer 9 was further formed thereon, so that the organic EL panel of Example 1 was manufactured, in which the organic EL panel had, as both surfaces, a light-emitting surface having a light-emitting region, the size of which corresponds to the size of the organic EL element, and a sealing surface, which had a transparent electrode layer-side power feeding portion in the vicinity of one of opposite sides and a reflective electrode layer-side power feeding portion in the vicinity of the other of the opposite sides, and on which an inorganic sealing layer was formed.

The thus-manufactured organic EL element of the organic EL panel of Example 1 was supplied with a constant current of 3 mA/cm$^2$ from the transparent electrode layer-side power feeding portion on which the inorganic sealing layer 9 of the sealing surface was not formed, so as to be exposed, and from the reflective electrode layer-side power feeding portion, and the total luminous flux of the organic EL panel was measured by a total luminous flux measuring device provided with an integrating sphere. Thereby, an electric power luminous efficiency (1 m/W) was calculated and compared with the electric power luminous efficiencies of Comparative Examples 1 and 2, described below, by supposing that the electric power luminous efficiency of the organic EL panel of Example 1 was 1. Table 1 summarizes the results of comparison among the electric power luminous efficiencies of Example 1 and the Comparative Examples, described below.

TABLE 1

|  | Example 1 | Comparative Example 1 | Comparative Example 2 |
|---|---|---|---|
| Relative value of electric power luminous efficiency | 1 | 0.6 | 0.7 |

Further, a leakage current value (A) when voltage 2 V was applied to the organic EL element of the organic EL panel of Example 1 prior to starting light emission was measured and compared with each of the leakage current values of the Comparative Examples, described below. Table 2 summarizes comparison results of the leakage current values of Example 1 and the Comparative Examples, described below.

TABLE 2

|  | Example 1 | Comparative Example 1 | Comparative Example 2 |
|---|---|---|---|
| Leakage current | $10^{-9}$ A | $10^{-7}$ A | $10^{-9}$ A |

In addition to evaluation described above regarding the organic EL elements, sheet resistance of an ITO film was measured using the element-forming substrate after the ITO film was formed, and compared with the ITO sheet resistance value of each of the Comparative Examples described below. Table 3 summarizes the results of comparison of the ITO sheet resistance values of Example 1 and the respective Comparative Examples described below.

TABLE 3

|  | Example 1 | Comparative Example 1 | Comparative Example 2 |
|---|---|---|---|
| Sheet resistance | 10.9 Ω/sq | 10.7 Ω/sq | 51.2 Ω/sq |

Comparative Example 1

As Comparative Example 1, mounting and fusing, etc. of an acrylic resin film for forming an uneven structure and formation of a light scattering flattening layer in Example 1 were not performed, and in other words, the element-forming substrate of Comparative Example 1 was manufactured by forming an alkali barrier film on a chemically strengthened thin-plate glass base material, without forming an acrylic resin uneven layer or a light scattering flattening layer.

Subsequently, an organic EL element and an inorganic sealing layer were formed on the element-forming substrate of Comparative Example 1 in the same manner as in Example 1, whereby an organic EL panel of Comparative Example 1 was manufactured.

Comparative Example 2

As Comparative Example 2, mounting and fusing of an acrylic resin film for forming an uneven structure, formation of an alkali barrier film and formation of a light scattering flattening layer in Example 1 were not performed, and in other words, an organic EL panel of Comparative Example 2 was manufactured by using the chemically strengthened thin-plate glass base material itself which was used in Example 1 as an element-forming substrate, and forming an organic EL element and an inorganic sealing layer in the same manner as in Example 1. In other words, in Comparative Example 2, the ITO film was directly formed on the chemically strengthened thin-plate glass base material.

As is clear from Tables 1 and 2, in the sample of Comparative Example 1 provided with the alkali barrier film, compared to Comparative Example 2 in which the alkali barrier film was not provided, a decrease in power efficiency due to absorption of the alkali barrier film and an increase in leakage current due to surface unevenness of the alkali barrier film were observed. Further, as is clear from Table 3, in Comparative Example 2 in which the alkali barrier film was not provided, an increase in the ITO sheet resistance value due elution of alkali ions contained in the chemically strengthened glass into the ITO film was observed. From the above results, it is clear that the organic EL elements of Comparative Example 1 and Comparative Example 2 cannot achieve sufficient performance as an organic EL element.

On the other hand, in the sample of Example 1 prepared by using the element-forming substrate in which the uneven layer, the alkali barrier film and the light scattering flattening layer were formed in order on the chemically strengthened thin-plate glass base material, improvement in power efficiency and inhibition of leakage current were observed when compared with Comparative Example 1, and an increase in sheet resistance value, which was observed in Comparative Example 2, was not observed.

EXPLANATION OF REFERENCE CHARACTERS

1 Chemically strengthened thin-plate glass base material
2 Alkali barrier film

3 Uneven layer
4 Flattening layer
6 Transparent conductive film
7 Organic functional layer
8 Reflective conductive film
9 Sealing layer

The invention claimed is:

1. A flexible organic EL panel, comprising a chemically strengthened thin-plate glass base material having an average thickness of 2 mm or less and an organic EL element, and having a light-emitting region corresponding to the organic EL element on a light-emitting surface thereof, wherein an element-forming substrate comprising an alkali barrier film comprising an amorphous silica-based film is formed on an entire surface of one main surface of the chemically strengthened thin-plate base material, and the organic EL element is formed in contact with an element-forming region of the alkali barrier film;

the alkali barrier film has a smooth surface region on a surface in the side in contact with the organic EL element; and further the smooth surface region has a surface smoothness of Ra of 5 nm or less and includes the element-forming region in plan view.

2. The flexible organic EL panel according to claim 1, wherein the alkali barrier film further comprises a photo-curable resin-containing flattening layer between the amorphous silica-based film and the organic EL element in the smooth surface region, in plan view.

3. The flexible organic EL panel according to claim 2, wherein the flattening layer is a light scattering flattening layer containing fine particles of a transparent metal oxide having a refractive index of 1.8 or more.

4. The flexible organic EL panel according to claim 2, wherein the alkali barrier film further comprises an uneven layer in the element-forming region in plan view between the chemically strengthened thin-plate glass base material and the amorphous silica-based film, the uneven layer comprising at least one selected from the group consisting of a thermoplastic resin and glass frit, and the uneven layer having an uneven surface in the amorphous silica-based film side.

5. The flexible organic EL panel according to claim 4, wherein the uneven layer is an acrylic resin-based uneven layer comprising an acrylic resin as a main component.

* * * * *